United States Patent
Suzuki

(10) Patent No.: US 6,815,369 B2
(45) Date of Patent: Nov. 9, 2004

(54) METHOD FOR MONITORING DEPOSITION REACTION DURING PROCESSING THE SURFACE OF A SEMICONDUCTOR SUBSTRATE

(75) Inventor: Koji Suzuki, Chiba (JP)

(73) Assignee: Kawasaki Microelectronics Inc., Chiba (JP)

( * ) Notice: Subject to any disclaimer, the term of this patent is extended or adjusted under 35 U.S.C. 154(b) by 98 days.

(21) Appl. No.: 09/970,763

(22) Filed: Oct. 5, 2001

(65) Prior Publication Data

US 2002/0040765 A1 Apr. 11, 2002

(30) Foreign Application Priority Data

Oct. 6, 2000 (JP) ........................................ 2000-307237

(51) Int. Cl.⁷ ........................ H01L 21/31; H01L 21/306
(52) U.S. Cl. .................. 438/758; 156/345.13
(58) Field of Search ............................... 438/758, 759, 438/771, 776; 134/1, 1.1, 22.1, 1.2, 1.3; 156/345.1, 345.13, 345.15, 345.29, 345.4, 345.42, 345.43, 345.46, 643.1, 345; 118/723

(56) References Cited

U.S. PATENT DOCUMENTS

| | | | | |
|---|---|---|---|---|
| 5,525,159 A | * | 6/1996 | Hama et al. ............... | 118/723 I |
| 5,576,629 A | | 11/1996 | Turner et al. | |
| 6,197,116 B1 | | 3/2001 | Kosugi | |
| 6,215,087 B1 | * | 4/2001 | Akahori et al. ......... | 219/121.43 |
| 6,283,130 B1 | * | 9/2001 | Tamura ..................... | 134/1.1 |
| 6,296,946 B1 | * | 10/2001 | Kotera et al. ............. | 428/473.5 |
| 6,311,638 B1 | | 11/2001 | Ishii et al. | |
| 6,333,269 B2 | * | 12/2001 | Naito et al. .................. | 438/706 |
| 6,440,260 B1 | | 8/2002 | Denda et al. | |
| 6,509,542 B1 | * | 1/2003 | Benjamin et al. ....... | 219/121.43 |
| 6,528,115 B1 | * | 3/2003 | Hirano et al. ............. | 427/249.1 |
| 6,532,796 B1 | * | 3/2003 | Ikeda ............................ | 73/37 |
| 6,685,797 B2 | | 2/2004 | Matsumoto et al. | |
| 2003/0068846 A1 | * | 4/2003 | Moise et al. ................. | 438/200 |

FOREIGN PATENT DOCUMENTS

| | | |
|---|---|---|
| JP | 6-52996 | 2/1994 |
| JP | 8-199378 | 8/1996 |
| JP | 11-260596 | 9/1999 |

* cited by examiner

*Primary Examiner*—George Fourson
*Assistant Examiner*—Brook Kebede
(74) *Attorney, Agent, or Firm*—Oliff & Berridge, PLC

(57) ABSTRACT

A semiconductor manufacturing apparatus and a method for processing a surface of a substrate are provided, which can realize a process at a constant etching rate, a low microloading effect, high selectivity, high reproducibility, and high dimensional controllability. The semiconductor manufacturing apparatus generates plasma by supplying electromagnetic waves to a gas atmosphere and processes the surface of the substrate with charged species in the plasma accelerated by a bias voltage applied to the substrate. At least the bias voltage is measured and at least the electrical power of the electromagnetic waves is controlled such that the bias voltage is controlled.

22 Claims, 5 Drawing Sheets

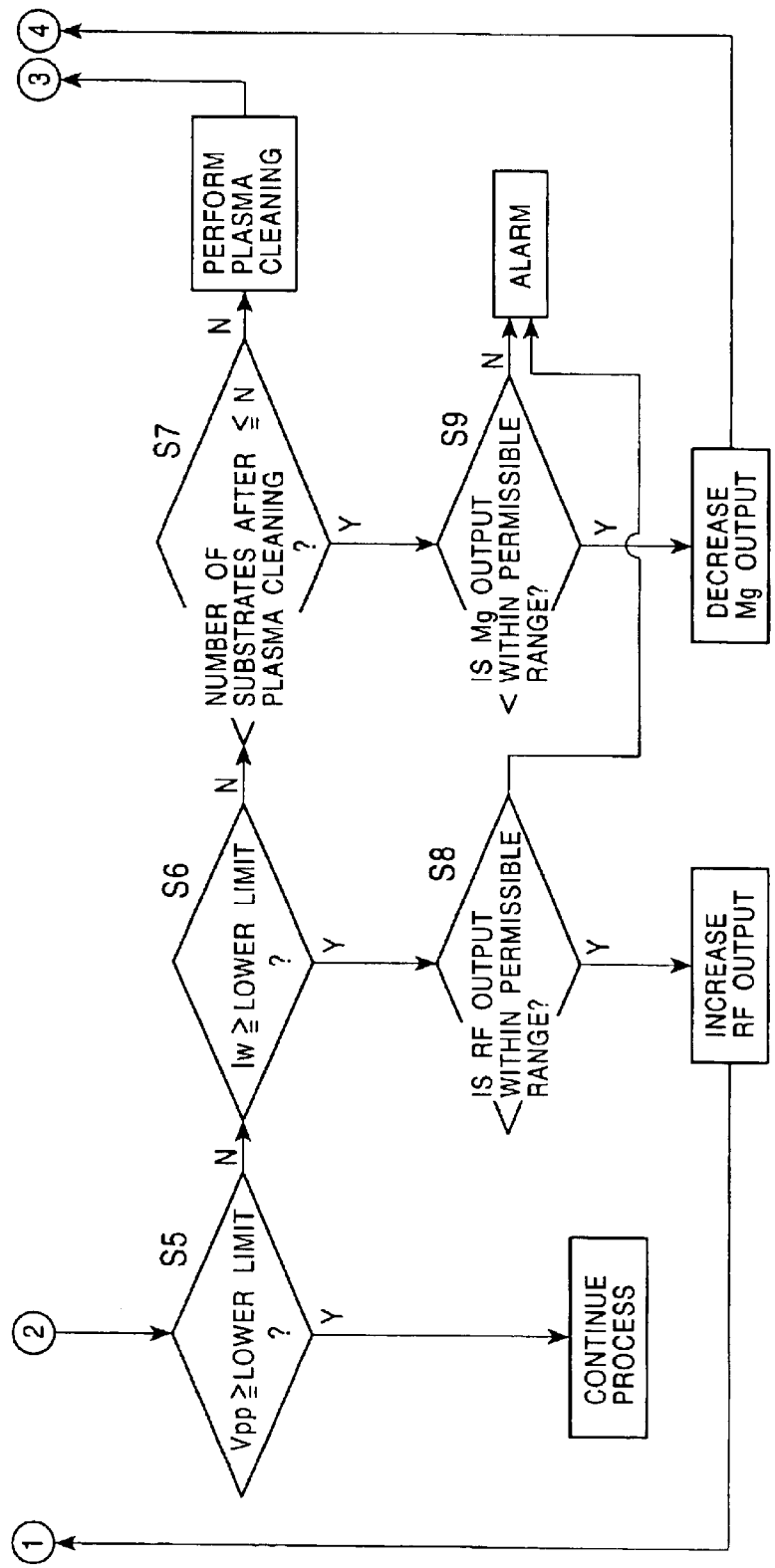

METHOD FOR MONITORING DEPOSITION REACTION DURING PROCESSING THE SURFACE OF A SEMICONDUCTOR SUBSTRATE

BACKGROUND OF THE INVENTION

1. Field of Invention

This invention relates to a semiconductor manufacturing apparatus, methods for processing a surface of a substrate, and methods for monitoring deposition of reaction products.

2. Description of Related Art

The manufacturing of semiconductor devices utilizes plasma etching and various other plasma processes to etch or otherwise process the surface of a semiconductor substrate. For example, anisotropical plasma etching is performed by i) placing a substrate having a film or layer to be etched on a substrate holder in an etching chamber, ii) providing a etching gas atmosphere suitable to etch the film or layer into the chamber, iii) generating plasma in the chamber by supplying electromagnetic energy to the gas atmosphere, iv) applying a bias voltage to the substrate, and v) etching the film or layer by directing active species generated in the plasma onto the surface of the substrate.

The plasma is usually generated using microwaves or radio frequency RF) electromagnetic waves of 13.56 MHz, 27 MHz, 60 MHz, and so on. As a typical discharge method to generate the plasma, ECR Electron Cyclotron Resonance) or ICP (Inductive Coupled Plasma) may be mentioned. High-density plasma can be generated at a low pressure by these methods. The bias voltage is applied to the substrate by supplying RF electromagnetic waves of 400 kHz, 22 MHz, and so on, to the substrate holder, which also acts as an electrode.

In the plasma etching for manufacturing semiconductor devices, improvements in characteristics, such as high dimensional controllability, low microloading effect, high selectivity, and high reproducibility, have been increasingly demanded. Because there are complicated trade-off relationships between the above-mentioned characteristics, however, a stable region in which every demand can be satisfied is extremely small. In addition, such stable region actually changes when a large number of substrates are successively etched in the same chamber for the actual production of semiconductor devices.

Therefore, various parameters of the process should be properly controlled in order to realize stable production of semiconductor devices. For example, Japanese Unexamined Patent Application Publication No. Hei 8-199378 (JP 8-199378) addresses the problem that the bias voltage varies in time. This publication discloses maintaining the bias voltage at a predetermined value by controlling the RF electric power supplied to the substrate holder,

SUMMARY OF THE INVENTION

An object of this invention is to provide an apparatus and a method, which are suitable to use in the production of semiconductor devices, to etch or otherwise process a surface of a substrate with improved stability.

Another object of this invention is to provide a method for monitoring deposition of reaction products on the inner wall of a chamber of an etching or other processing apparatus. The monitoring method can be suitably used to control the process.

The inventor has discovered that, in general, instability of interaction between the plasma and the inner wall or a ground electrode within the chamber causes an instability of the process. The plasma interacts with the inner wall or the ground electrode. Therefore, the state of plasma changes when the surface state of the inner wall or the ground electrode is changed, even though the electric power of first electromagnetic waves is maintained at a constant value. As a result, the bias voltage, which is generated by the interaction of second electromagnetic waves with the plasma, changes even though the power of the second electromagnetic waves is maintained at a constant value.

The inventor has also discovered that the change in the interaction can be directly monitored by measuring a ground current flowing from the plasma to the inner wall or the ground electrode, and indirectly monitored by measuring the bias voltage. Controlling the electric power of the first electromagnetic waves used to generate the plasma can compensate the change in the interaction Thereby, a stable process can be realized even though it is difficult to prevent the change of the interactions An exemplary embodiment of an apparatus according to the invention includes a chamber that contains a gas atmosphere, the chamber including an inner wall; a substrate holder within the chamber that holds the substrate; a plasma source that generates a plasma by supplying first electromagnetic waves with a first electric power to the gas atmosphere; a bias source that generates a bias voltage by supplying second electromagnetic waves with a second electric power to the substrate holder; and a controller. Charged species in the plasma are accelerated by the bias voltage and directed toward the surface of the substrate so that the surface is processed by the accelerated charged species. The controller produces a control signal by monitoring the bias voltage and a ground current that flows from the plasma to the inner wall of the chamber, the control singal is used to control the first electric power.

In some other exemplary embodiments of the apparatus according to the invention, the controller controls the first electric power such that the bias voltage is maintained within a selected range by increasing the first electric power when the bias voltage is higher than a selected upper limit and decreasing the first electric power when the bias voltage is lower than a selected lower limit.

In some other exemplary embodiments of the apparatus according to the invention, the inner wall is situated such that reaction products deposit on the inner wall, the reaction products deposited on the inner wall have an influence on the plasma; and the controller controls the first electric power to compensate the influence of the reaction products deposited on the inner wall. The controller monitors an amount of the reaction products deposited on the inner wall by monitoring the bias voltage; and the controller decreases the first electric power when an increase in the amount of the reaction products is monitored and increases the first electric power when a decrease in the amount of the reaction products is monitored.

An exemplary embodiment of the methods for processing a surface of a substrate according to the invention includes holding the substrate on a substrate holder in a chamber, the chamber including an inner wall; generating a plasma by supplying first electromagnetic waves with a first electric power to a gas atmosphere within the chamber; applying a bias voltage to the substrate by supplying second electromagnetic waves with a second electric power to the substrates holder so that the surface of the substrate is processed by charged species in the plasma accelerated by the bias voltage; monitoring the bias voltage and a ground current that flows from the plasma to the inner wall of the chamber to produce a control signal; and controlling the first electric power using the control signal.

An exemplary embodiment of the methods for processing a surface of a substrate according to the invention includes controlling the first electric power, by increasing the first electric power when the bias voltage is higher than a selected upper limit, and by decreasing the first electric power when the bias voltage is lower than a selected lower limit.

An exemplary embodiment of the methods for processing a surface of a substrate according to the invention includes controlling the first electric power to maintain the bias voltage within a selected range; and when the bias voltage is not maintained within the selected range, controlling the second electric power to maintain the bias voltage within the selected range.

Some exemplary embodiments of the methods for processing a surface of a substrate according to the invention include controlling the first electric power and the second electric power by a) monitoring the bias voltage and a ground current that flows from the plasma to the inner wall; and b) when the bias voltage is outside of a first selected range and the ground current is outside of a second selected range, changing the first electric power.

An exemplary embodiment of the methods for successively processing a plurality of substrates in a chamber includes holding one of the plurality of the substrates on a substrate holder within the chamber, the chamber including an inner wall; generating a plasma by supplying first electromagnetic waves with a first electric power to a gas atmosphere within the chamber; applying a bias voltage to the substrate by supplying second electromagnetic waves with a second electric power to the substrate holder so that the surface of the substrate is processed by charged species in the plasma accelerated by the bias voltage; depositing reaction products on the inner wall of the chamber, the reaction products deposited on the inner wall having an influence on the plasma; monitoring an amount of the reaction products deposited on the inner wall by monitoring the bias voltage; and controlling the first electric power to compensate the influence of the reaction products. The controlling includes decreasing the first electric power when an increase in the amount of the reaction products is monitored, and increasing the first electric power when a decrease in the amount of the reaction products is monitored.

An exemplary embodiment of the methods of monitoring deposition of reaction products on an inner wall of a chamber according to the invention includes generating a plasma by supplying first electromagnetic waves with a first electric power to a gas atmosphere within the chamber, the chamber including an inner wall; depositing reaction products onto the inner wall of the chamber; and measuring a ground current that flows from the plasma to the inner wall of the chamber on which the reaction products are deposited.

BRIEF DESCRIPTION OF THE DRAWINGS

FIGS. 2A and 2B show a flowchart describing operation of control in a method for processing a surface of a substrate according to an embodiment of this invention;

DETAILED DESCRIPTION OF PREFERRED EMBODIMENTS

This invention was first described in Japanese Patent Application 2000-307237, hereby incorporated by reference in its entirety.

First, a conventional ECR plasma etching apparatus and etching process will be described, and the origin of the problem in the conventional technique will be discussed.

Figure 5:
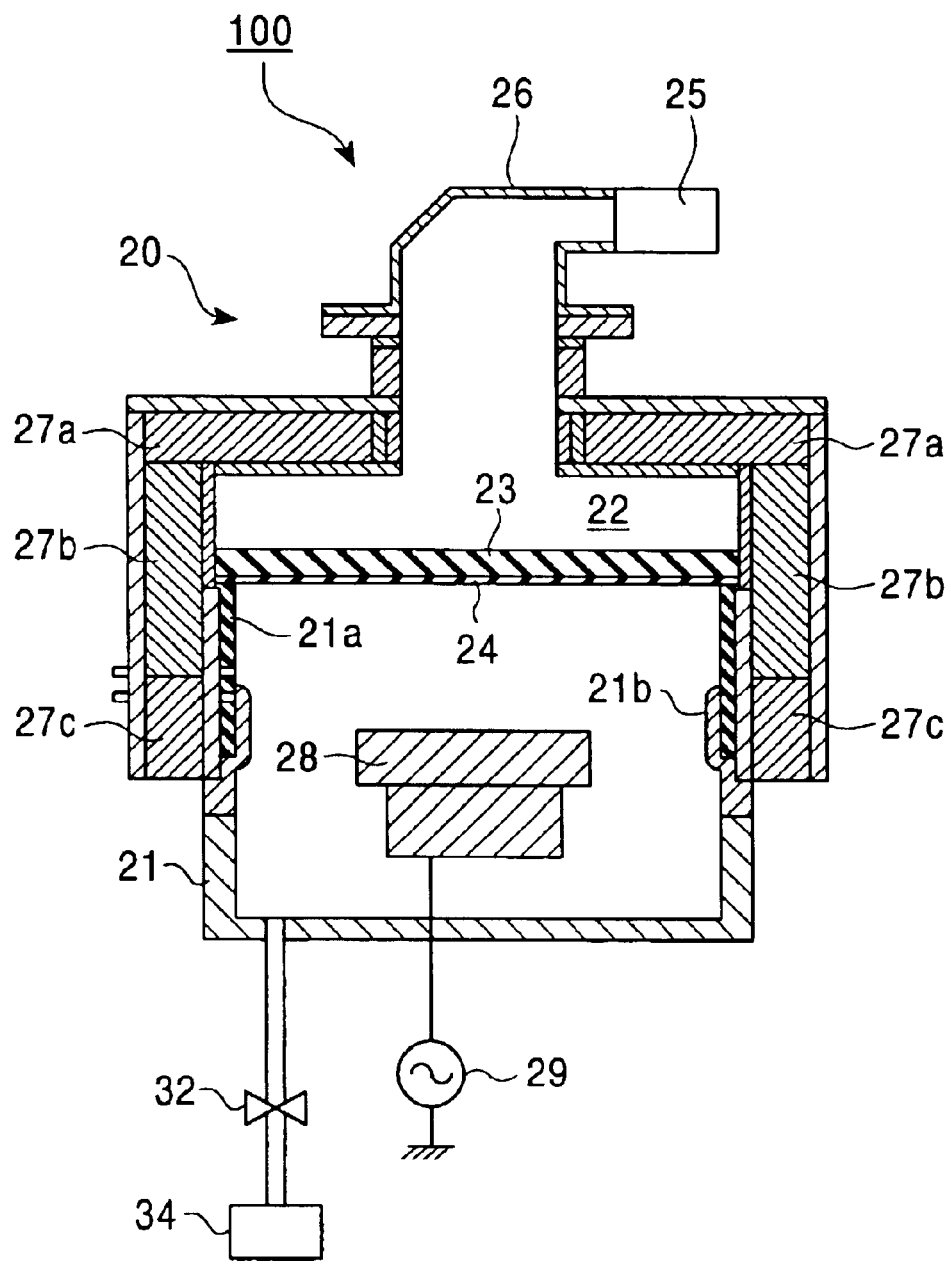
FIG. 5 is a cross-sectional view schematically showing a conventional semiconductor manufacturing apparatus.

FIG. 5 shows an ECR plasma etching apparatus 100. The plasma etching apparatus 100 includes a chamber 21. Above an upper portion of the chamber 21, a cavity resonant portion 22 is provided. The cavity resonant portion 22 is separated from the chamber by, for example, a quartz top plate 23.

Under the quartz top plate 23, a quartz gas shower plate 24 is provided in parallel to the top plate. A gap is provided between the top plate 23 and the gas shower plate 24 A gas inlet tube (not shown) is connected to this gap. Small holes are concentrically provided in the shower plate 24. Various process gases are supplied from the gas inlet tube to the gap and then into the chamber 21 through the shower plate 24.

Simultaneously, the inside of the chamber 21 is evacuated by using a vacuum pump 34 via a variable conductance valve 32, and hence, the pressure inside the chamber 21 is controlled. Thereby, various gas atmospheres suitable for etching can be formed in the chamber 21.

One end of a waveguide tube 26 is connected to the cavity resonant portion 22, and the other end of the waveguide tube 26 is connected to a microwave supply 25 for supplying microwaves, which are first electromagnetic waves. Coils 27a, 27b, and 27c are provided in a concentric manner around the peripheries of one end of the waveguide tube 26, the cavity resonant portion 22, and the upper portion of the chamber 21. DC power supplies (not shown) are connected to the coils 27a, 27b, and 27c. The cavity resonant portion 22, the microwave supply 25, the waveguide tube 26, the coils 27a, 27b, and 27c, form a plasma source 20.

The plasma source 20 generates plasma in the upper portion of the chamber 21 by supplying microwaves with an appropriate electric power to the gas atmosphere in the chamber. Various neutral active species (radicals) and charged active species (ions) are produced in the plasma.

The upper portion of the chamber 21 is lined with a quartz tube 21a for insulation, and a ground electrode 21b, which is held at the ground potential, is provided. The ground electrode 21b acts as an inner wall of the chamber 21, to which the plasma touches. A ground current flows from the plasma to the ground electrode 21b, and excessive charges in the plasma are absorbed to the ground electrode 21b.

At the central portion of the chamber 21, a lower electrode 28 is provided. The top of the lower electrode 28 is used as a substrate holder to hold a substrate (not shown). A RF power supply 29 is connected to the lower electrode 28. RF electromagnetic waves, which are second electromagnetic waves, are supplied to the lower electrode 28. Or, to be exact, the RF power is supplied to the lower electrode 28 and the RF electromagnetic waves are supplied to the plasma through the lower electrode 28. A bias voltage is generated by the second electromagnetic waves and applied to the substrate. The RF power, supply 29 forms a bias source.

The bias voltage is generated by an interaction between the plasma in the chamber and the second electromagnetic waves supplied to the lower electrode 28. Therefore, the bias voltage depends not only on the frequency and the electric power of the second electromagnetic waves but also on the state, e.g., ion density, of the plasma.

When etching is performed on the surface of the substrate using the plasma etching apparatus 400 described above, active species generated in the plasma are directed onto the surface of the substrate. The bias voltage controls the energy of the charged species directed on the surface of the substrate. Therefore, the bias voltage should be controlled within a proper range to achieve desirable processing.

However, the bias voltage may vary due to variation of grounding ability in the chamber during successive processing of a number of substrates even though the electric powers of first and the second electromagnetic waves are maintained at constant values.

That is, ion bombardment onto the surface of the ground electrode 21b and deposition of reaction products (etched and/or plasma-generated products) from the plasma onto the surface of the ground electrode 21b occur during the successive processing using the plasma etching apparatus 100 described above. Such bombardment and deposition influence the surface of the ground electrode 21b and the grounding ability of the ground electrode 21b decreases with time. As a result, when the electric power of the first electromagnetic waves is kept at a fed value, the ground current flows from the plasma to the ground electrode 21b gradually decreases and the ion density in the plasma gradually increases during the successive processing.

A peak-to-peak voltage (hereinafter simply referred to as a "Vpp") of the bias voltage decreases when the ion density is increased. The decrease in Vpp causes a decrease in the energy of ions directed onto the surface of the substrate to be processed. As a result, the microloading effect (decrease of etching rate in small spaces) is enhanced.

In the etching apparatus 100, the ground electrode 21b is positioned so as to provide a reference potential for the bias voltage, and the remaining upper portion of the chamber, within which the plasma is generated, is lined with the quartz tube 21a. Therefore, the change in the surface condition of the ground electrode 21b, or the change in the grounding ability significantly influences the bias voltage.

In the contact hole formation process, it is important to maintain a high selectivity with respect to an underlying layer, e.g., a silicon or a silicide layer, or a silicon nitride film in a self-aligned contact (SAC) structure. For this purpose, a gas having a high C/F ratio, such as $C_4F_8$, is used so that the etching of silicon oxide film proceeds only slightly more preferentially over deposition of a fluorocarbon film. Accordingly, when the grounding ability decreases, the ion energy decreases and deposition preferentially proceeds relative to etching. As a result, an etching stop, i.e., incomplete etching in small holes due to the deposition of fluorocarbon film may occur.

Similarly, in the etching of nitride films for forming isolation regions, i.e., formation of local oxidation of silicon (LOCOS) regions, a high etching selectivity with respect to a thin underlying layer of, for example, silicon oxide is required. The high selectivity is also required in gate etching, i.e., etching of polysilicon or polycide films over a thin gate dielectric film. In such etching processes, the microloading effect is also enhanced when grounding ability is decreased.

In the etching apparatus 100, the ground electrode 21b is replaceable. The ground electrode can be replaced when it is damaged, contaminated, or otherwise degraded, with a new or cleaned ground electrode.

When the ground electrode is replaced, the grounding ability is recovered. When the grounding ability of a new electrode is higher than that of a replaced ground electrode due to a difference between parts, however, the ion density in the plasma is decreased. Thus, the Vpp of the lower electrode increases in order to maintain a predetermined electric power of the second electromagnetic waves As a result, the energy of ions directed onto the substrate increases, and hence, the selectivity with respect to underlying layer degrades.

In addition to the long-term variations described above, there are also short-term variations due to, for example, differences between lots and between wafers within a lot.

A periodic plasma cleaning may be performed to remove the reaction products deposited on various surfaces within the chamber. The surface of the ground electrode may also be cleaned and the grounding ability of the ground electrode may be recovered after the plasma cleaning. The grounding ability, however, gradually decreases by the deposition of reaction products, or the like, in accordance with an increased number of processed wafers after the plasma cleaning. Consequently, a middle-term variation in the etching characteristics occurs, even though such middle-term variation may not be as serious as the long-term variation described above.

The method proposed in JP 8-199378, i.e., maintaining the bias voltage at a predetermine value by controlling the RF electric power supplied to the substrate holder, might be effective to overcome the short-term variation caused by the difference in the substrate. However, the long-term and the middle-term variations originated by the instability of the interaction between the plasma and an inner wall or a ground electrode within the chamber cannot be solved by this method.

For example, when the grounding ability decreases due to damage and/or deposition on the inner wall or the ground electrode, the ion density in the plasma increases and the bias voltage decreases. If the bias voltage is maintained by controlling the electric power of the second electromagnetic waves supplied to the lower electrode, the electric power of the second electromagnetic waves increases. Then, the amount of ion bombardment onto the surface of the substrate increases because the ion density is increased. As a result, the damage by the ion bombardment onto the surface of the substrate increases. That is, for example, undesirable etching of the underlying layer occurs.

Similarly, when the grounding ability increases by the replacement of the ground electrode, the ion density in the plasma decreases and the bias voltage increases, If the bias voltage is maintained by controlling the electric power of the second electromagnetic waves, the electric power of the second electromagnetic waves decreases. Then, the amount of ion bombardment onto the surface of the substrate decreases because the ion density is decreased. As a result, the microloading effect is enhanced and, for example, insufficient etching in small areas occurs.

Thus, a novel method to solve the problem of instability originated by the instability of the interaction between the plasma and the inner wall or the ground electrode within the chamber is required.

As discussed in the previous paragraphs, when the surface condition of the inner wall or the ground electrode is changed by, for example, deposition or removal of reaction products, the grounding ability in the chamber changes. The change in the surface condition or the grounding ability influences the interaction between the plasma and the inner wall or the ground electrode. That is, the ground current flows from the plasma to the inner wall or the ground electrode changes. As a result, the ion density in the plasma changes when the electric power of the first electromagnetic wave is kept constant. Then, the bias voltage changes when the electric power of the second electromagnetic wave is kept constant.

Base on the proper understanding of relationships between these phenomena, it is possible to monitor the change in the surface condition or the interaction by monitoring the bias voltage and, optionally, the ground current. Controlling the electric power of the first electromagnetic wave can compensate the influence of the change. For example, the change in the surface condition or the amount of deposition of the reaction products on the inner wall or the ground electrode can be monitored by monitoring the bias voltage, and the influence of the change can be compensated by controlling the electric power of the first electromagnetic wave.

The apparatus and the method according to this invention will be described in detail with reference to a preferred embodiment shown in the figures.

Figure 1:
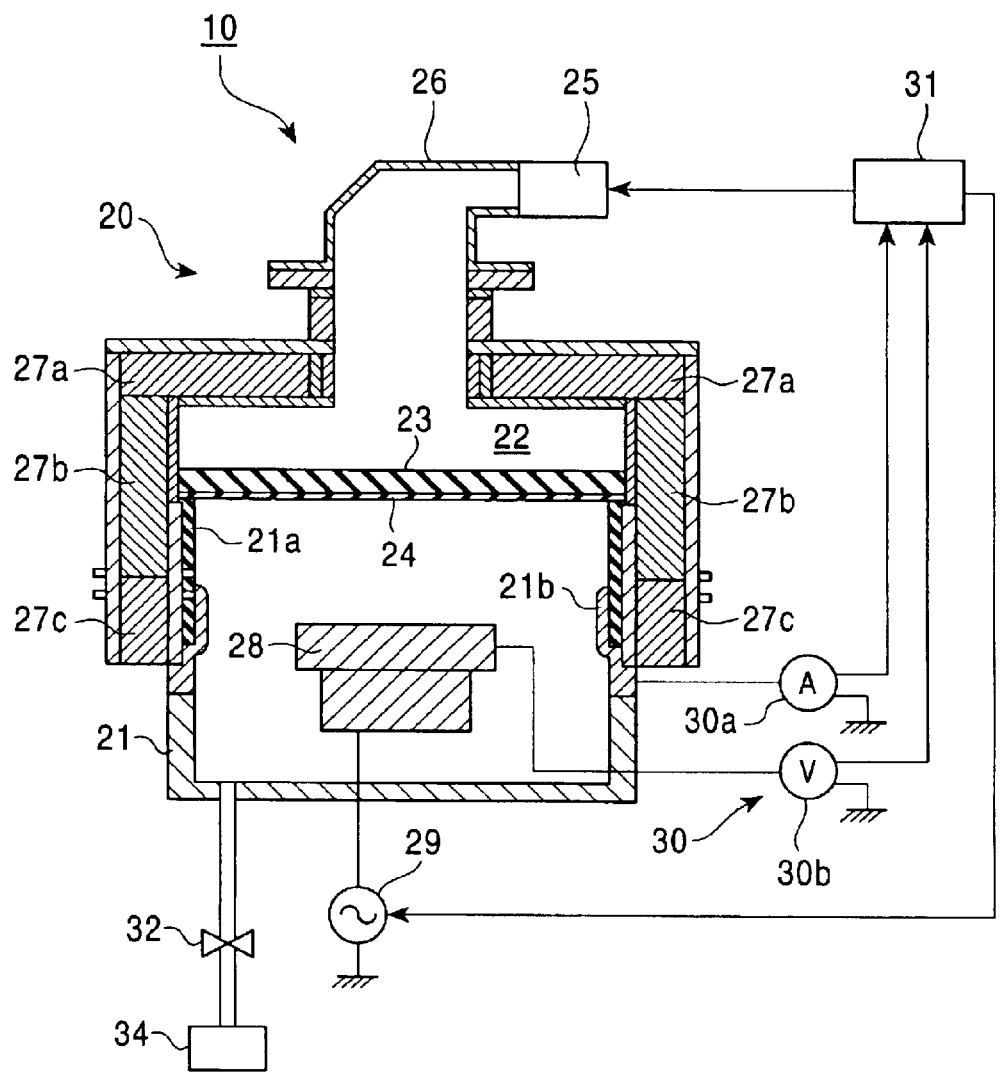
FIG. 1 is a schematic cross-sectional view showing a semiconductor manufacturing apparatus according to an embodiment of this invention.

FIG. 1 shows an ECR plasma etching apparatus, for use in the production of semiconductor devices, according to an embodiment of the invention. In this apparatus, the method for processing the substrate and the method for monitoring the deposition of reaction produces according to this invention are performed. However, the invention is not limited to the embodiment of the apparatus shown in FIG. 1.

The plasma etching apparatus 10 shown in FIG. 1 has some similar features as those of the plasma etching apparatus 100 shown in FIG. 5. However, the plasma etching apparatus 10 comprises different features, including a controller 31 and a measurement unit 30 with a current measurement unit 30a and a voltage measurement unit 30b. The same reference numerals of components shown in FIG. 5 designate the same components shown in FIG. 1. The descriptions of the same components are omitted, and the different features from the plasma etching apparatus 100 will be described.

The plasma etching apparatus 10 shown in FIG. 1 includes a measurement unit 30. This measurement unit 30 includes a ground current measurement unit 30a and a bias voltage measurement unit 30b The current measurement unit 30a measures a ground current flowing from the plasma to the ground electrode 21b, which is held at the ground potential and to which the plasma contacts. The bias voltage measurement unit 30b measures the bias voltage generated by applying the second electromagnetic waves to the lower electrode 28. However, the invention is not limited to the structure described above, and the measurement unit 30 may, in some embodiments, include only the bias voltage measurement unit 30b. Accordingly, in the invention, the measurement unit 30 may serve to measure at least the bias voltage The ground electrode 21b is connected to one terminal of the ground current measurement unit 30a for measuring the ground current, and another terminal of the ground current measurement unit 30a is grounded. That is, the ground electrode 21b is grounded through the ground current measurement unit 30a, and is held at the ground potential. The ground current measurement unit 30a produces a signal corresponding to the measured current, which is sent to the controller 31.

The lower electrode 28 is connected to one terminal of the bias voltage measurement unit 30b for measuring the bias voltage The bias voltage measurement unit 30b produces a signal corresponding to the measured bias voltage, which is provided to the controller 31. The bias voltage measurement unit 30b measures, for example, a peak-to-peak voltage (Vpp) of the bias voltage.

The controller 31 receives the signals corresponding to the measured ground current and the measured bias voltage from the ground current measurement unit 30a and the bias voltage measurement unit 30b, respectively. Thus, the controller 31 monitors the ground current and the bias voltage through the ground current measurement unit 30a and the bias voltage measurement unit 30b.

A predetermined or selected permissible range centered at a standard ground current is set in the controller 31 for the ground current. Also, a predetermined or selected permissible range centered at a standard bias voltage is also set in the controller 31 for the bias voltage. Using these predetermined or selected ranges and the received signals from the measurement unit 30, the controller determines whether the bias voltage and the ground current are within the respective predetermined or selected ranges or not.

Based on the result of the determination, the controller 31 produces a control signal to control, i.e., to increase or decrease the electric power of the microwaves. The produced control signal is supplied to the microwave supply 25. Then, the microwave supply 25 adjusts the output power of the microwaves (the first electromagnetic waves) using the control signal received from the controller 31.

For example, when the bias voltage is lower than the lower limit of the predetermined or selected range, the power of the microwaves is decreased to decrease the ion density in the plasma. As a result, the decrease in the bias voltage due to the increase in the ion density originated by the decrease in the grounding ability is compensated without excessively increasing the ion bombardment onto the substrate. On the other hand, when the bias voltage is higher than the upper limit of the predetermined or selected range, the power of the microwaves is increased to increase the ion density in the plasma. As a result, the increase in the bias voltage due to the decrease in the ion density originated by the increase in the grounding ability is compensated without excessively decreasing the ion bombardment onto the substrate.

Accordingly, the bias voltage can be maintained within the predetermined or selected range without significantly changing the amount of ion bombardment onto the substrate. That is, the problem of instability of the bias voltage originated by the instability of the interaction between the plasma and the inner wall or the ground electrode is effectively solved.

Note that, Japanese Unexamined Patent Application Publication No. Hei 6-52996 (JP 6-52996) addresses another problem originated by the deposition of reaction products. That is, JP 6-52996 addresses the problem that the electric power of the microwave supplied to the plasma through a quartz plate changes when reaction products deposit on the quartz plate. To solve this problem, JP 6-52996 proposes to control the output of the microwave supply in order to compensate the change in the microwave power due to the deposition on the quartz plate.

However, the inventor has discovered that, even though the electric power of the microwave supplied to the gas atmosphere or the plasma is kept substantially constant, the bias voltage varies due to the change of the grounding ability of the inner wall or the ground electrode. Accordingly, the controller 31 in the embodiment of this invention controls the microwave supply 25 not just to keep the electric power of the microwave (the first electromagnetic wave) supplied to the gas atmosphere constant. Rather, the controller 31 controls the microwave supply such that the electric power of the first electromagnetic wave supplied to the gas atmosphere actually changes to compensate the change in the grounding ability.

In addition, the etching apparatus 10 has a configuration to supply the gas atmosphere different from that used in the apparatus shown in JP 6-52996. Because of this difference, the deposition of reaction products on the shower plate 24 in the etching apparatus 10 is small and does not substantially influence the plasma. In the etching apparatus 10, the reaction products mainly deposit on the quartz tube 21a and on the ground electrode 21b. Thus, the primary origin of the instability of the plasma in the etching apparatus 10 is the instability of the grounding ability due to the deposition on the ground electrode 21b.

Therefore, the controller 31 in the embodiment of this invention controls the electric power of the first electromagnetic wave quite differently from that in JP 6-52996. That is, in JP 6-52996, the reaction products deposited on the quartz plate, through which the microwave is supplied, absorb the microwave, and decrease the electric power of the microwave supplied to the plasma. Therefore, an increase in the output of the microwave supply would be necessitated when the amount of deposition is increased. On the contrary, in the etching apparatus 10, the reaction products deposited on the ground electrode 21b decrease the grounding ability of the ground electrode and the ion density in the plasma is increased due to the decrease in the grounding ability, Therefore, the output of the microwave supply should be decreased when the amount of deposition is increased.

In the plasma etching apparatus 10 shown in FIG. 1, the controller 31 is also connected to the RF power supply 29, which supplies the second electromagnetic waves to the lower electrode 28 to generate the bias voltage. Therefore, the control signal produced by the controller 31 can also control, i.e., increase or decrease the output power of, the RE power supply 29.

Even if the bias voltage measured by the voltage measurement unit 30b is higher than the upper limit of the predetermined or selected range, there are cases that it is more appropriate to decrease the RF power rather than to increase the microwave power. In such case, the controller 31 produces a control signal to decrease the RF power, and supplies the produced control signal to the RF power supply 29. Similarly, even if the bias voltage is lower than the lower limit of the predetermined or selected range, there are cases that it is more appropriate to increase the RF power rather than to decrease the microwave power. In such case, the controller 31 produces a control signal to increase the RF power, and supplies the produced control signal to the RF power supply 29. Thereby, the bias voltage is maintained within the predetermined or selected range by controlling the power of the second electromagnetic waves.

For example, if the bias voltage is changed due to a difference of the wafer, it is more appropriate to control the RF power. In such case, the bias voltage changes without a significant change of the ground current. Therefore, in order to determine whether the control of the RF power is appropriate or not, it is determined, for example, whether a ground current is in the predetermined or selected range or not.

In the plasma etching apparatus 10 shown in FIG. 1, the controller 31 is connected to both of the microwave supply 25 and the RF power supply 29. However, the invention is not limited to the structure described above, and the controller 31 may only be connected to the microwave supply 25. Accordingly, in the invention, the controller 31 may control both the electric powers of the first and the second electromagnetic waves, or may only control the electric power of the first electromagnetic waves.

Embodiments of the apparatus of this invention have the basic construction described above, and with reference to this structure, the method of processing a surface of a substrate and the method of monitoring the deposition according to the invention will be described in detail.

In the method for processing a surface of a substrate, at least the bias voltage is measured and, at least the power of the first electromagnetic waves is controlled to maintain the bias voltage within the predetermined or selected range at least a certain period during the processing.

A permissive range including a standard bias voltage is set for the bias voltage. The permissive range is centered at the standard or target bias voltage and has a lower limit and an upper limit, which are permissible as the targets. The permissive range may be set, for example, in the range of ±2.5% about the standard bias voltage. The permissive range is predetermined or selected and stored in the controller 31.

The range is preferably predetermined or selected for each etching step. The bias voltage may change even at a constant ion density due to change in the layer to be etched on the substrate. Therefore, the control is preferably made in each etching step to maintain the bias voltage within the range predetermined or selected for each etching step.

A signal corresponding to the bias voltage measured by the voltage measurement unit 30b is input the controller 31. When the controller 31 determines that the bias voltage indicated by the measured signal is higher than the upper limit of the predetermined or selected range, the controller produces a signal indicating an increase in the power of the microwaves, which is input to the microwave supply 25. The electrical power of the microwaves is thereby controlled, i.e., decreased, whereby the bias voltage is maintained within the predetermined range.

The control signal input to the microwave supply 25 may be a signal indicating an increase of a predetermined or selected value. In this case, in order to maintain the bias voltage within the predetermined or selected range, the measurement of the bias voltage and the control of the microwave power are repeatedly performed.

The controller may produce a control signal dependent on the deference of the measured bias voltage and the standard value. This method of producing the control signal enables to make the permissive range narrower. It might be possible to set a zero permissive range, i.e., set the upper and the lower limits equal to the standard value, depending on the method of producing the control signal.

It may also be possible that the control signal indicates an amount of increase in the microwave power required for maintaining the bias voltage within the permissive range. In this case, the controller 31 determines the amount of increase depending on the measured bias voltage using a correction equation or a correction table.

In contrast, when the measured bias voltage is lower than the lower limit of the predetermined or selected range, a signal indicating a decrease in microwave power is produced by the controller 31 and input to the microwave supply.

As described above, the change in ion density in the plasma is monitored by measuring the bias voltage using the voltage measurement unit 30b, and the bias voltage is maintained within the permissive range by controlling the microwave supply 25 in accordance with the measured bias voltage. Thereby, an amount and energy of ions directed onto the surface of the substrate are kept effectively constant, and an effectively constant etching rate can be obtained. Consequently, a low microloading effect, high selectivity, high reproducibility, and high dimensional controllability can be achieved.

It is believed that the change in the ion density in the plasma is generally caused by the change in the environment in the chamber 21, such as the deposition of reaction products, or the like, or the replacement of the ground electrode 21b. That is, it is believed that the change in the ion density is caused by the change in the grounding ability in the chamber. In such case, it is preferable that the control of the electrical power of the microwave, which is the first electromagnetic wave, is performed.

In such case, it is not necessary to perform control of the electric power of RF, which is the second electromagnetic wave. Or, the control of the RF power has an adverse effect as explained above.

However, there is a case in which the change in bias voltage occurs due to a reason other than the grounding ability. In this case, the control of the electrical power of the RF used to apply the bias voltage is preferably performed.

It may be a case that the bias voltage cannot be maintained in the permissive range by controlling only the electrical power of the microwaves, that is, for example, the bias voltage cannot be maintained within the predetermined or desired range by varying the microwave power in a permissive variable range. In such case, the bias voltage can be maintained within the predetermined or selected range by additionally controlling the RF power.

It may also be possible that when the change in bias voltage is detected, the ground current is measured and is then compared to a predetermined or selected range in order to determine whether the change in the bias voltage is caused by the change in the grounding ability. Depending on the result of this determination, it is determined which of the microwave power and the RF power should be controlled. That is, when the measured ground current is outside the predetermined or selected range, the microwave electrical power is controlled. On the other hand, when the measured ground current is within the predetermined or selected range, the RF electrical power is controlled.

In the case described above, a permissive range for the ground current centered at a standard ground current is predetermined and stored in the controller 31. The permissive range is centered at a standard or target ground current and has a lower limit and an upper limit, which are permissive as the targets. The permissive range may be set, for example, in the range of ±8% about the standard ground current. The predetermined or selected range is preferably set for each etching step.

It is also possible, when the measured ground current is outside of the predetermined or selected range, to determine whether the change of the ground current is originated by the change of the grounding ability. That is, for example, the direction of the change of the ground current can be compared with a direction expected of the change originated by the change of the grounding ability. If the direction is not consistent with the expected direction, it is determined that the change is not originated by the change of the grounding ability.

In that case, the RF electric power, instead of the microwave power, can be controlled. It is also possible to stop the processing after producing an alarm signal.

In the production of the semiconductor devices, a number of substrates (wafers) are successively processed in the same chamber. When processing is successively performed according to the method of the invention, there is a case in which the microwave electrical power is changed from the originally set value and the succeeding wafers are processed with the changed microwave power. In this case, the predetermined or selected value of the ground current may preferably be set to be dependent on the microwave power. Thus, when the change of the bias voltage is again detected, the determination whether the change of the bias voltage is originated by the change of the grounding ability can be made properly.

Alternatively, when the microwave electrical power is changed, the ground current immediately after the change of the microwave power may be measured and is stored in the controller 31. When the change in the bias voltage is again detected, the measured ground current and the stored ground current are compared so as to determine the reason of the change of the bias voltage. For example, if the measured ground current is outside (either in an absolute value or in a ratio) of a predetermined or selected permissible range from the stored ground current, it is determined that the change in the grounding ability again occurs. The microwave electrical power is again controlled. If, on the other hand, the measured ground current is within the predetermined or selected permissible range from the stored value, it is determined that the change in the grounding ability does not again occur. And the RF power is controlled.

When the reaction products or the like deposit on the ground electrode 21b or on the inner wall of the chamber 21 after successive processing of a number of wafers, the deposited products may release various species into the plasma. The released species may change the composition of active species in the plasma, even though the amount of deposition is not sufficient to significantly change the bias voltage. As a result, selectivity to an underlying layer may change, or a taper of a side wall formed by etching may change. Accordingly, even if the bias voltage is not significantly changed, it is preferable that the change in ground current be monitored continuously, or at least at when predetermined numbers of wafers are processed.

In the method for processing the surface of the substrate according to the invention, the measurement of the bias voltage is performed at least once in the period during which the processing is performed on the surface of the substrate. The measurement may be performed once or at least twice during the processing, or it may be performed continuously or repeatedly during the entire processing period.

It is preferable that, while the surface of the substrate is actually being processed, the bias voltage is measured in real time and the microwave electrical power is controlled. However, when a considerable change in the environment in the chamber is expected, for example, when the ground electrode is replaced, it is preferable that the measurement of the bias voltage and the control of the microwave electrical power be first performed on a dummy wafer. After the apparatus is adjusted such that the bias voltage is within the predetermined or selected range, actual processing of the surface of the substrate can then be started.

In this case, the measurement of the bias voltage and the control of the microwave electrical power are performed in a certain period of time during the entire processing including adjustment of the apparatus. That is, the measurement and the control are made on at least one of the substrate to be processed including the dummy wafer. It is possible the measurement and the control are only made during the adjustment. Of course, it is preferable that the measurement and the control are performed both in the adjustment step and in real time during the actual processing of product wafers.

Figure 2A:
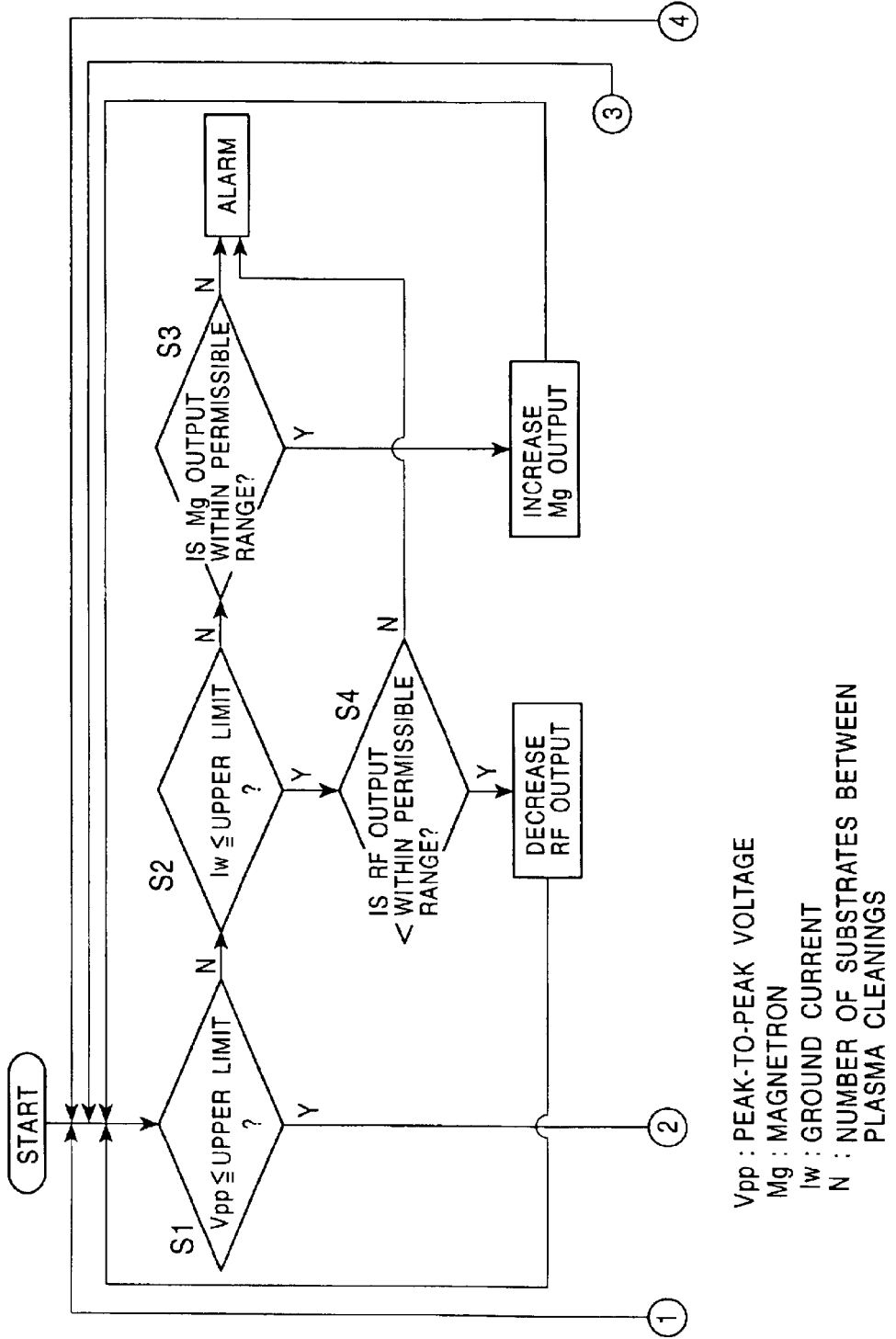

Next, a method for maintaining the bias voltage in a predetermined range by the control of the electrical power of the first electromagnetic waves, with or without the control of the electrical power of the second electromagnetic waves, will be described with reference to the flowchart shown in FIGS. 2A and 2B.

When the control is started, in step S1, it is determined whether a measured bias voltage Vpp is equal to or lower than the upper limit of the permissive range of the bias voltage. When the measured bias voltage is determined to be higher than the upper limit, in step S2, it is determined whether a measured ground current Iw is equal to or lower than the upper limit of the permissive range of the ground current. When the ground current Iw is determined to be higher than the upper limit, in step S3, it is determined whether an output of the magnetron Mg, which is the power supply of the microwaves (the first electromagnetic waves), is within the permissible range. When the output of the magnetron Mg is determined to be outside the permissible range, an alarm signal is produced and the process is halted. When the magnetron output Mg is determined to be within the permissible range, a signal indicating an increase in the magnetron output is output to the magnetron from the controller as described above, and subsequently, the flow returns to step S1.

In step S2, when the ground current Iw is determined to be equal to or lower than the upper limit of the permissive range, in step S4, it is determined whether an output of the RF power supply, which is the supply source of the second electromagnetic waves, is within the permissible range. When the output of the RF power supply (hereinafter referred to as RF output) is determined to be outside the permissible range, an alarm signal is produced and the process is halted. When the RF output is determined to be within the permissible range, a signal indicating a decrease in the RF output is output to the RF power supply from the controller as described above, and subsequently, the flow returns to step S1.

In contrast, in step S1, when the measured bias voltage Vpp is determined to be equal to or lower than the upper limit, in step S5, it is determined whether the bias voltage Vpp is equal to or higher than the lower limit. When the bias voltage Vpp is determined to be lower than the lower limit, in step S6, it is determined whether the ground current Iw is equal to or higher than the lower limit When the ground current is determined to be lower than the lower limit, in step S7, it is determined whether the number of processed substrates after the previous plasma cleaning is equal to or less than N. The number N is predetermined or selected as a number of substrates that can be processed between plasma cleanings. When the number of the processed substrates is more than N, it is considered that the amount of reaction products deposited onto the inner wall of the chamber is more than a permissive upper limit, and the plasma cleaning is performed. The number N may be appropriately determined, for example, within the number of wafers contained in a lot (a cassette), or within the number of wafers contained in two lots (two cassettes).

However, when the number of processed wafers is equal to or less than N, it is determined that the deposition of the reaction products is not the reason for the decrease in the ground current. In this case, in step S9, it is determined whether the magnetron output Mg is within the permissible range. When the magnetron output Mg is determined to be outside the permissible range, an alarm signal is produced and the process is halted. When the magnetron output Mg is determined to be within the permissible range, a signal indicating a decrease in the magnetron output is output to the magnetron from the controller as described above, and subsequently, the flow returns to step S1.

When the ground current is determined to be equal to or higher than the lower limit in step S6, in step S8, it is determined whether the RF output is within the permissible range. When the RF output is determined to be outside the permissible range, an alarm signal is produced and the process is halted. When the RF output is determined to be within the permissible range, a signal indicating an increase in the RF output is output to the RF power supply from the controller as described above, and subsequently, the flow returns to step S1.

When it is determined in step S5 that the bias voltage is equal to or higher than the lower limit of the permissive range, the etching process is continued.

EXAMPLES

The invention will be further described with reference to Examples of the invention. In the Examples, the ECR plasma etching apparatus 10 according to embodiments of this invention is used for etching a polysilicon film, and the results are compared to those obtained using the conventional ECR etching apparatus shown in FIG. 5.

First Example and First Comparative Example

Samples are prepared by forming a 4 nm thick gate oxide film by thermal oxidation on a silicon substrate, and a 200 nm thick undoped polysilicon film by a chemical vapor deposition (CVD) method on the gate oxide film. A resist pattern having a line width of approximately 0.15 $\mu$m is provided on the polysilicon film.

The samples thus prepared are etched by using $Cl_2$—HBr—$O_2$—based etching gas atmosphere. And the difference in dimensions before and after the etching, i.e., the difference in the widths of the resist pattern before the etching and that of the polysilicon pattern etched using the resist as a mask, (hereinafter referred to as a pattern shift) are measured using a dimension-measuring scanning electron microscope (SEM).

Figure 3:
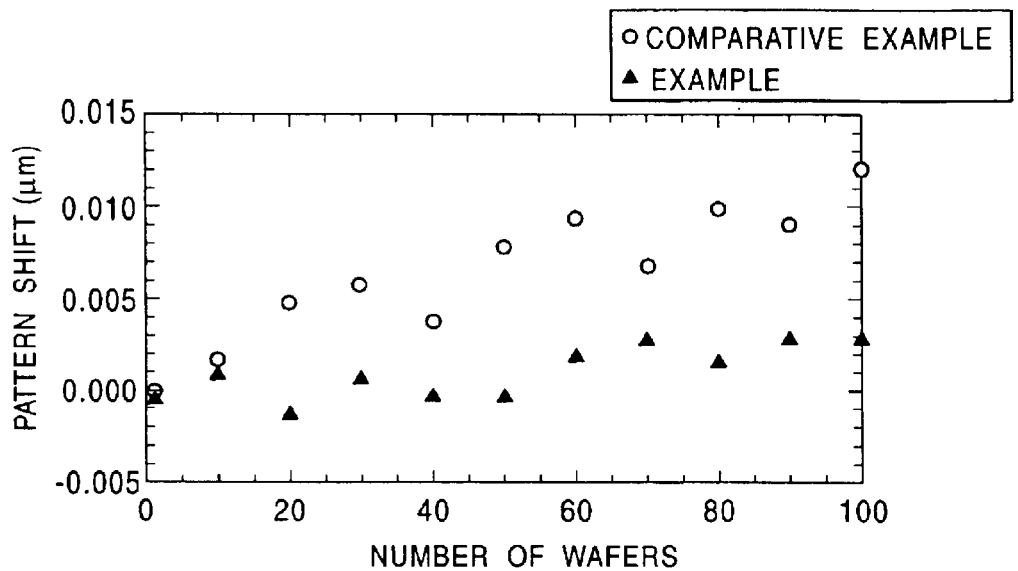
FIG. 3 is a graph showing variation of pattern shift in successive processing of a number of wafers in the first Example and in the first Comparative Example.

FIG. 3 is a graph showing the pattern shifts during successive etching of 100 wafers after a plasma cleaning using an $SF_6$—based gas atmosphere. In FIG. 3, the vertical axis indicates the pattern shift ($\mu$m) and the horizontal axis indicates the cumulative number of processed wafers. Symbol Δ represents the pattern shift for the first Example processed by an embodiment of the method of processing a surface of a substrate according to this invention. In this case, the microwaves for generating the plasma (the first electromagnetic waves) are controlled such that the bias voltage remains within the predetermined range and is approximately equal to each other. On the other hand, symbol ○ represents the pattern shift for the first Comparative Example processed by the conventional method. In this case, the microwave power is kept constant.

Other processing conditions for the first Example and the first Comparative Example are as follows:

Flow Rate of $Cl_2$, HBr, and $O_2$: 50 sccm, 50 sccm, and 5 sccm.

Gas pressure: 0.5 Pa.

RF Power and Frequency: 30 W and 800 kHz.

Permissive Range of Bias Voltage:±2.5%.

It is clear from FIG. 3 that the pattern shift is significantly reduced by the control of the first electromagnetic wave. That is, a high dimensional controllability is realized. Specifically, the maximum pattern shift in the first Example during the continuous processing of 100 wafers was ±0.005 µm or less. On the other hand, the maximum pattern shift in the first Comparative Example is +0.01 µm or more.

Second Example and Second Comparative Example

Product samples are prepared by forming a 4 nm thick gate oxide film by thermal oxidation on a silicon wafer, and a 200 nm thick undoped polysilicon film by a CVD method on the gate oxide. A resist pattern is formed on the polysilicon film. Samples for selectivity measurement are also prepared by forming a 100 nm thick oxide film by thermal oxidation on a silicon wafer, and a resist pattern is provided on the oxide film.

The product samples thus formed are etched, and in addition, the samples for selectivity measurement are periodically etched by using $HBr-O_2$-based etching gas atmosphere, which is typically used for the overetching. The thickness of the polysilicon film on the product sample and the gate oxide film on the sample for selectivity measurement is measured before and after the etching using an optical thickness meter. The selectivity (ratio of etching rate of the polysilicon film over that of the oxide film) is calculated.

In the second Example and the second Comparative Example, the selectivities of the polysilicon film over the oxide film are measured before and after a replacement of the ground electrode.

Figure 4:
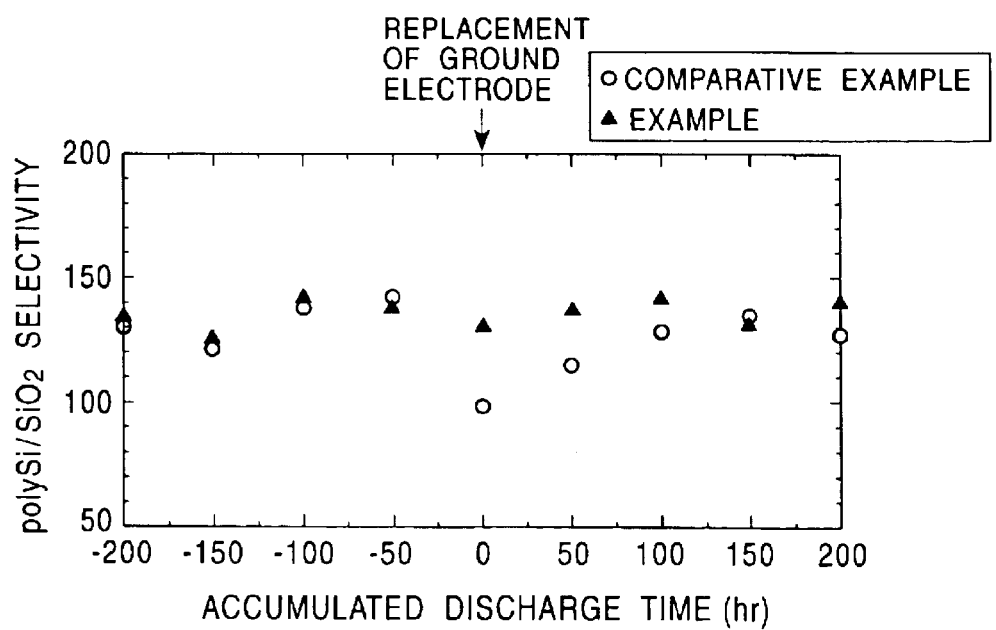
FIG. 4 is a graph showing change in selectivity caused by replacement of a ground electrode in the second Example and in the second Comparative Example.

FIG. 4 is a graph showing the change in the selectivity with time. The vertical axis indicates the polysilicon/silicon dioxide selectivity, and the horizontal axis indicates the accumulated discharge time (hours).

The symbol Δ represents the selectivity obtained in the second example processed by the processing method according to this invention. In this case, electric power of the microwaves for generating the plasma (the first electromagnetic waves) is controlled such that the bias voltage is maintained within a predetermined range and is approximately equal to each other. On the other hand, the symbol ○ represents the selectivity obtained in the second Comparative Example processed by the conventional method. In this case, the microwave power is kept constant.

Other processing conditions for the second Example and the second Comparative Example are as follows:

Flow Rate of HBr and $O_2$: 100 sccm and 5 sccm.

Gas Pressure: 1.5 Pa.

Frequency: 800 KHz.

Permissive Range of Bias Voltage:±2.5%.

It is clear from FIG. 4 that the variation of the selectivity after the change of the ground electrode is significantly suppressed by the processing method of the invention. That is, in the second Comparative Example, the selectivity is abruptly reduced from about 140 before the replacement of the ground electrode to about 90 after the replacement. About 100 wafers are needed be processed before the selectivity recovers to about 120. It is considered in the second Comparative Example that the bias voltage is increased after the replacement of the ground electrode because the grounding ability is recovered. Thereafter, etching of silicon dioxide, which is assisted by ion bombardment, is enhanced, and the polysilicon/silicon dioxide selectivity is decreased by 20% or more.

In contrast, in the second Example, the selectivity is not substantially influenced by the replacement of the ground electrode. Thus, high process performance can be maintained.

According to this invention, the bias voltage is measured and at least the power of the first electromagnetic waves for generating the plasma is controlled such that the bias voltage is maintained within a permissive range. As a result, the amount and energy of charged species directed onto the surface of the substrate is kept substantially constant.

Preferably, the ground current flowing from the plasma to the inner wall of the chamber or the ground electrode is also measured. By this measurement, state of the plasma in the chamber can be monitored. That is, interaction of the plasma with the inner wall of the chamber or the ground electrode, which is influenced by deposition of etched and/or plasma-generated products on the inner wall or the ground electrode, can be monitored.

Based on the result of the monitoring of the interaction of the plasma and the inner wall or the ground electrode, the first electromagnetic waves and/or the second electromagnetic waves for applying bias voltage to the substrate are properly controlled. That is, it cam be properly determined which of the first and the second electromagnetic waves should be controlled.

As a result, according to the invention, without being influenced by chamber cleanings, part replacements, and the state of deposition of reaction products caused by successive processing, a stable process can always be performed. That is, microloading effect, etching stops, degradation of selectivity, pattern shift, and so on, caused by the change in the environment in the chamber can be effectively suppressed.

What is claimed is:

1. An apparatus for processing a surface of a substrate, comprising:

a chamber that contains a gas atmosphere, the chamber including an inner wall;

a substrate holder within the chamber that holds the substrate;

a plasma source that generates a plasma by supplying first electromagnetic waves with a first electric power to the gas atmosphere and generates a ground current that flows from the plasma to the inner wall by absorbing charges in the plasma to the inner wall;

a bias source that generates a bias voltage by supplying second electromagnetic waves with a second electric power to the substrate holder, charged species in the plasma being accelerated by the bias voltage and directed toward the surface of the substrate so that the surface is processed by the accelerated charged species; and a controller that produces a control signal by monitoring the bias voltage and the ground current that flows from the plasma to the inner wall of the chamber, the control signal being used to control the first electric power.

2. The apparatus according to claim 1, wherein the inner wall is a ground electrode electrically isolated from a remaining portion of the chamber.

3. The apparatus according to claim 2, wherein the ground electrode is replaceable.

4. The apparatus according to claim 1, wherein the controller controls the first electric power and the second electric power using the control signal.

5. An apparatus for processing a surface of a substrate, comprising:
a chamber that contains a gas atmosphere, the chamber including an inner wall;
a substrate holder within the chamber that holds the substrate;
a plasma source that generates a plasma by supplying first electromagnetic waves with a first electric power to the gas atmosphere;
a bias source that generates a bias voltage by supplying second electromagnetic waves with a second electric power to the substrate holder, charged species in the plasma being accelerated by the bias voltage and directed toward the surface of the substrate so that the surface is processed by the accelerated charged species; and
a controller that controls the first electric power such that the bias voltage is maintained within a selected range by increasing the first electric power when the bias voltage is higher than a selected upper limit and decreasing the first electric power when the bias voltage is lower than a selected lower limit.

6. An apparatus for processing a surface of a substrate, comprising:
a chamber that contains a gas atmosphere, the chamber including an inner wall;
a substrate holder within the chamber that holds the substrate;
a plasma source that generates a plasma by supplying first electromagnetic waves with a first electric power to the gas atmosphere and generates a around current that flows from the plasma to the inner wall of the chamber by absorbing charges in the plasma to the inner wall, the inner wall being situated such that reaction products deposit on the inner wall, the reaction products deposited on the inner wall having an influence on the plasma;
a bias source that generates a bias voltage by supplying second electromagnetic waves with a second electric power to the substrate holder, charged species in the plasma being accelerated by the bias voltage and directed toward the surface of the substrate so that the surface is processed by the accelerated charged species; and
a controller that controls the first electric power to compensate the influence of the reaction products deposited on the inner wall, wherein:
the controller monitors an amount of the reaction products deposited on the inner wall by monitoring the bias voltage; and
the controller decreases the first electric power when an increase in the amount of the reaction products is monitored and increases the first electric power when a decrease in the amount of the reaction products is monitored.

7. The apparatus according to claim 6, wherein the controller monitors the amount of the reaction products by monitoring the bias voltage and the ground current that flows from the plasma to the inner wall.

8. The apparatus according to claim 7, wherein the inner wall is a ground electrode electrically isolated from a remaining portion of the chamber.

9. An apparatus for processing a surface of a substrate, comprising:
means for holding the substrate on a substrate holder in a chamber, the chamber including an inner wall;
means for generating a plasma by supplying first electromagnetic waves with a first electric power to a gas atmosphere within the chamber and for generating a ground current flowing from the plasma to the inner wall of the chamber by absorbing charges in the plasma to the inner wall;
means for applying a bias voltage to the substrate by supplying second electromagnetic waves with a second electric power to the substrate holder so that the surface of the substrate is processed by charged species in the plasma accelerated by the bias voltage;
means for monitoring the bias voltage and the ground current that flows from the plasma to the inner wall of the chamber to produce a control signal; and
means for controlling the first electric power using the control signal.

10. A method for processing a surface of a substrate, comprising:
holding the substrate on a substrate holder in a chamber, the chamber including an inner wall;
generating a plasma by supplying first electromagnetic waves with a first electric power to a gas atmosphere within the chamber;
generating a around current that flows from the plasma to the inner wall of the chamber by absorbing charges in the plasma to the inner wall;
applying a bias voltage to the substrate by supplying second electromagnetic waves with a second electric power to the substrate holder so that the surface of the substrate is processed by charged species in the plasma accelerated by the bias voltage;
monitoring the bias voltage and the ground current that flows from the plasma to the inner wall of the chamber to produce a control signal; and
controlling the first electric power using the control signal.

11. The method according to claim 10, wherein the controlling comprises controlling the first electric power and the second electric power using the control signal.

12. The method according to claim 10, wherein the inner wall is a ground electrode electrically isolated from a remaining portion of the chamber.

13. A method for processing a surface of a substrate, comprising:
holding the substrate on a substrate holder in a chamber, the chamber including an inner wall;
generating a plasma by supplying first electromagnetic waves with a first electric power to a gas atmosphere within the chamber;
applying a bias voltage to the substrate by supplying second electromagnetic waves with a second electric power to the substrate holder so that the surface of the substrate is processed by charged species in the plasma accelerated by the bias voltage;
controlling the first electric power, including increasing the first electric power when the bias voltage is higher than a selected upper limit, and decreasing the first electric power when the bias voltage is lower than a selected lower limit.

14. A method for processing a surface of a substrate, comprising:
holding the substrate on a substrate holder in a chamber, the chamber including an inner wall;
generating a plasma by supplying first electromagnetic waves with a first electric power to a gas atmosphere within the chamber;

applying a bias voltage to the substrate by supplying second electromagnetic waves with a second electric power to the substrate holder so that the surface of the substrate is processed by charged species in the plasma accelerated by the bias voltage;

controlling the first electric power to maintain the bias voltage within a selected range; and when the bias voltage is not maintained within the selected range, controlling the second electric power to maintain the bias voltage within the selected range.

15. A method for processing a surface of a substrate, comprising:

holding the substrate on a substrate holder in a chamber, the chamber having an inner wall;

generating a plasma by supplying first electromagnetic waves with a first electric power to a gas atmosphere within the chamber;

generating a ground current that flows from the plasma to the inner wall of the chamber by absorbing charges in the plasma to the inner wall;

applying a bias voltage to the substrate by supplying second electromagnetic waves with a second electric power to the substrate holder so that the surface of the substrate is processed by charged species in the plasma accelerated by the bias voltage;

controlling the first electric power and the second electric power, including:
a) monitoring the bias voltage and the ground current that flows from the plasma to the inner wall; and
b) when the bias voltage is outside of a first selected range and the ground current is outside of a second selected range, changing the first electric power.

16. The method according to claim 15, wherein the controlling further comprises changing the second electric power when the bias voltage is outside of the first selected range and the ground current is within the second selected range.

17. The method according to claim 15, wherein the inner wall of the chamber is a ground electrode electrically isolated from a remaining portion of the chamber.

18. A method for successively processing a plurality of substrates in a chamber, comprising:

holding one of the plurality of the substrates on a substrate holder within the chamber, the chamber including an inner wall;

generating a plasma by supplying first electromagnetic waves with a first electric power to a gas atmosphere within the chamber;

applying a bias voltage to the substrate by supplying second electromagnetic waves with a second electric power to the substrate holder so that the surface of the substrate is processed by charged species in the plasma accelerated by the bias voltage;

depositing reaction products on the inner wall of the chamber, the reaction products deposited on the inner wall having an influence on the plasma;

monitoring an amount of the reaction products deposited on the inner wall by monitoring the bias voltage; and controlling the first electric power to compensate the influence of the reaction products, including decreasing the first electric power when an increase in the amount of the reaction products is monitored, and increasing the first electric power when a decrease in the amount of the reaction products is monitored.

19. The method according to claim 18, wherein the generating of the plasma is performed so that a ground current flows from the plasma to the inner wall of the chamber by absorbing charges in the plasma to the inner wall; and the monitoring monitors the amount of the reaction products by monitoring the bias voltage and the ground current that flows from the plasma to the inner wall.

20. The method according to claim 19, wherein the inner wall of the chamber is a ground electrode electrically isolated from a remaining portion of the chamber.

21. A method of monitoring deposition of reaction products on an inner wall of a chamber, comprising:

generating a plasma by supplying first electromagnetic waves with a first electric power to a gas atmosphere within the chamber, the chamber including an inner wall; generating a ground current that flows from the plasma to the inner wall of the chamber by absorbing charges in the plasma to the inner wall;

depositing the reaction products on the inner wall of the chamber from the plasma; and measuring the ground current that flows from the plasma to the inner wall of the chamber on which the reaction products are deposited.

22. The method according to claim 21, wherein the inner wall of the chamber is a ground electrode electrically isolated from a remaining portion of the chamber.

* * * * *